United States Patent [19]

Gnade et al.

[11] Patent Number: 5,348,894
[45] Date of Patent: Sep. 20, 1994

[54] METHOD OF FORMING ELECTRICAL CONNECTIONS TO HIGH DIELECTRIC CONSTANT MATERIALS

[75] Inventors: Bruce E. Gnade, Rowlett; Scott R. Summerfelt, Dallas, both of Tex.

[73] Assignee: Texas Instruments Incorporated, Dallas, Tex.

[21] Appl. No.: 9,521

[22] Filed: Jan. 27, 1993

[51] Int. Cl.⁵ .............................................. H01G 4/06
[52] U.S. Cl. ..................................... 437/12; 437/192; 437/60; 361/321.1
[58] Field of Search ................... 437/12, 52, 190, 195; 361/305, 321

[56] References Cited

U.S. PATENT DOCUMENTS

| 5,053,917 | 1/1991 | Miyasaka et al. | 361/321 |
| 5,164,808 | 11/1992 | Evans, Jr. et al. | 361/305 |
| 5,187,638 | 2/1993 | Sandhu et al. | 361/313 |
| 5,194,395 | 3/1993 | Wada | 437/10 |
| 5,242,861 | 9/1993 | Inaba | 437/190 |

FOREIGN PATENT DOCUMENTS

4-338619 11/1992 Japan.
4-360506 12/1992 Japan.

OTHER PUBLICATIONS

Yasushiro Nishioka et al., "Time Dependent, Dielectric Breakdown Characteristics of $Ta_2O_5/SiO_2$ Double Layers," *Journal of the Electrochemical Society,* vol. 136, No. 3, Mar. 1989, pp. 872–873.
Shigeaki Zaima et al., "Conduction Mechanism of Leakage Current in $Ta_2O_5$ Films on Si Prepared by LPCVD," *Journal of the Electrochemical Society,* vol. 137, No. 9, Sep. 1990, pp. 2876–2879.
Yasushiro Nishioka et al. "Influence of $SiO_2$ at the Ta₂O₅/Si Interface on Dielectric Characteristics of $Ta_2O_5$ Capacitors," *Journal of Applied Physics,* 61 (6), Mar. 15, 1987, pp. 2335–2338.
Yasushiro Nishioka et al., "Time Dependent, Dielectric Breakdown Characteristics of $Ta_2O_5/SiO_2$ Double Layers," *Journal of the Electrochemical Society,* vol. 136, No. 3, Mar. 1989, pp. 872–873.
Shigeaki Zaima et al., "Conduction Mechanism of Leakage Current in $Ta_2O_5$ Films on Si Prepared by LPCVD," *Journal of the Electrochemical Society,* vol. 137, No. 9, Sep. 1990, pp. 2876–2879.
Yasushiro Nishioka et al., "Influence of $SiO_2$ at the $Ta_2O_5$/Si Interface on Dielectric Characteristics of (List continued on next page.)

*Primary Examiner*—Olik Chaudhuri
*Assistant Examiner*—Ken Horton
*Attorney, Agent, or Firm*—Brian A. Carlson; James C. Kesterson; Richard L. Donaldson

[57] ABSTRACT

A preferred embodiment of this invention comprises an oxidizable layer (e.g. tantalum 48), an oxygen gettering layer (e.g. platinum/tantalum mixture 34) overlaying the oxidizable layer, a noble metal layer (e.g. platinum 36) overlaying the oxygen gettering layer, and a high-dielectric-constant material layer (e.g. barium strontium titanate 38) overlaying the noble metal layer. The novel structures presented provide electrical connection to high-dielectric-constant materials without the disadvantages of current structures. The oxygen gettering layer controls oxygen diffusion, minimizing the formation of a resistive layer either in the lower electrode or at the lower electrode/substrate interface. The oxygen gettering layer acts as a gettering site for oxygen, where the oxygen oxidizes the reactive metal portion of the layer, leaving the noble metal portion of the layer intact. While the oxides/suboxides (e.g. tantalum pentoxide 40) that are formed are resistive, they are dispersed within the noble metal matrix, leaving a conductive path from the top of the layer to the bottom. This invention provides a stable and electrically conductive electrode for high-dielectric-constant materials while using standard integrated circuit materials to facilitate and economize the manufacturing process.

18 Claims, 4 Drawing Sheets

OTHER PUBLICATIONS $Ta_2O_5$ Capacitors," *Journal of Applied Physics*, 61(6), Mar. 15, 1987, pp. 2335–2338.

Shigeaki Zaima et al., "Preparation and Properties of $Ta_2O_5$ Films by LPCVD for ULSI Application" *Journal of the Electrochemical Society*, vol. 137, No. 4, Apr. 1990, pp. 1297–13000.

G. Arlt et al., "Dielectric Properties of Fine-Grained Barium Titanate Ceramics," *Journal of Applied Physics*, 58 (4), Aug. 15, 1985, pp. 1619–1625.

Yoichi Miyasaka et al., "Dielectric Properties of Sputter-Deposited $BaTiO_3$-$SrRiO_3$ Thin Films," 0-78-03-0190-0/91$01.00 IEEE, pp. 121–124 (1991).

Q. X. Jia et al., "Reactively Sputtered $RuO_2$ Thin Film Resistor With Near Zero Temperature Coefficient of Resistance," *Thin Solid Films*, 196 (1991) pp. 29–34.

Kuniaki Koyama et al., "A Stacked Capacitor with $(Ba_xSr_{1-x})TiO_3$ For 256M DRAM," CH3075-9/91/00-00-0823 $1.00 1991 IEEE, pp. 823–826.

Toshiyuki Sakuma et al., "Barrier Layers for Realization of High Capacitance Density in $SiTiO_3$ Thin-Film Capacitor on Silicon," *Applied Physics Letter*, 57(23), Dec. 3, 1990, pp. 2431–2433.

METHOD OF FORMING ELECTRICAL CONNECTIONS TO HIGH DIELECTRIC CONSTANT MATERIALS

FIELD OF THE INVENTION

This invention generally relates to improving electrical connections to materials with high-dielectric-constants, such as in the construction of capacitors.

BACKGROUND OF THE INVENTION

Without limiting the scope of the invention, its background is described in connection with current methods of forming electrical connections to high-dielectric-constant materials, as an example.

The increasing density of integrated circuits (e.g. DRAMs) is increasing the need for materials with high-dielectric-constants to be used in electrical devices such as capacitors. The current method generally utilized to achieve higher capacitance per unit area is to increase the surface area/unit area by increasing the topography, such as in trench and stack capacitors using $SiO_2$ or $SiO_2/Si_3N_4$ as the dielectric. This approach becomes very difficult in terms of manufacturability for devices such as the 256 Mbit and 1 Gbit DRAMs.

An alternative approach is to use a high permittivity dielectric material. To be useful in electronic devices, however, reliable electrical connections should generally be constructed which do not diminish the beneficial properties of these high-dielectric-constant materials.

Heretofore, in this field, single and multiple metal layers are generally used to form electrical contacts to high-dielectric-constant materials. For example, to provide an electrical connection to a high-dielectric-constant material which makes up a capacitor on the surface of a semiconductor substrate, the following techniques are among those now employed: (a) dielectric/platinum/substrate, (b) dielectric/platinum/tantalum/substrate, and (c) dielectric/platinum/titanium/substrate. The layering sequence in these examples is from the top down to the substrate (e.g. silicon). A similar metallization scheme may be used for the top of the dielectric film to complete the capacitor structure.

SUMMARY OF THE INVENTION

As used herein the term high-dielectric-constant (hereafter abbreviated HDC) means a dielectric constant greater than about 20. HDC materials are useful for the fabrication of many electrical devices, such as capacitors. However, HDC materials are generally not chemically stable when deposited directly on a semiconductor substrate, so one or more additional layers are required to provide the electrical connection between the HDC material and the substrate. The additional layer or layers should generally be chemically stable when in contact with the substrate and also when in contact with the high-dielectric-constant material.

Current methods provide for using platinum as the noble layer to contact the high-dielectric-constant material, along with tantalum or titanium as the sticking layer to contact the substrate. However, HDC materials (e.g. ferroelectrics) are generally deposited at elevated temperatures (greater than about 500° C.) in an $O_2$ atmosphere. It has been discovered that, in this environment, oxygen diffuses through the platinum and forms a resistive layer of $Ta_2O_5$ or $TiO_2$ when it comes in contact with the Ta or Ti, causing high contact resistance. Further, the substrate (e.g. silicon) itself can become oxidized during the deposition of the HDC material. As used herein, the term oxidizable layer refers to the underlying sticking layer, or substrate, which becomes more insulating when oxidized.

The disclosed structures generally provide electrical connection to HDC materials without the disadvantages of the current structures. One embodiment of this invention comprises an oxidizable layer, an oxygen gettering layer overlaying the oxidizable layer, a noble metal layer overlaying the oxygen gettering layer, and a high-dielectric-constant material layer overlaying the noble metal layer. A method of forming an embodiment of this invention comprises the steps of forming a oxygen gettering layer on an oxidizable layer, forming a noble metal layer on the oxygen gettering layer, and forming a high-dielectric-constant material layer on the noble metal layer. Examples of processes for depositing the lower electrode materials are sputtering, evaporation, and chemical vapor deposition. Examples of processes for depositing the high-dielectric-constant material are ion-beam sputtering, chemical vapor deposition, and pulsed laser deposition.

These are apparently the first structures wherein an electrical connection to high-dielectric-constant materials comprises an oxygen gettering layer. The oxygen gettering layer controls oxygen diffusion, minimizing the formation of a resistive layer either in the oxidizable layer or at the oxidizable layer/oxygen gettering layer interface. The oxygen gettering layer acts as a gettering site for oxygen, wherein the oxygen oxidizes the reactive metal portion of the layer, leaving the noble metal portion of the layer intact. While the oxides or suboxides that are formed are resistive, they are dispersed within the noble metal matrix, leaving a conductive path from the top of the layer to the bottom. The oxygen gettering layer should generally contain enough reactive metal to successfully combine with most or all of the diffused oxygen, but not so much that there is not a conductive path remaining via the noble metal component of the layer. Generally, the required thickness and composition of the oxygen gettering layer depend on the specific deposition parameters (temperature, $O_2$ pressure, etc.) of the high-dielectric-constant material. If enough oxygen reaches the oxidizable layer (e.g. the sticking layer or the substrate), a resistive layer will be formed, significantly increasing the contact resistance. The noble metal layer between the high-dielectric-constant material layer and the oxygen gettering layer is desirable, as it both minimizes undesirable reduction of the high-dielectric-constant material layer and lowers the amount of oxygen which enters the oxygen gettering layer. This invention generally provides a stable electrode for HDC materials while using standard integrated circuit materials to facilitate and economize the manufacturing process.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
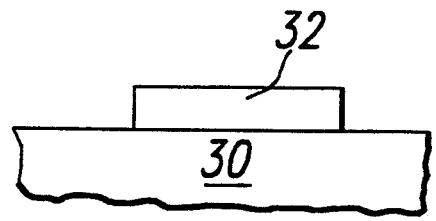
FIGS. 1–5 are cross-sectional views of a method for constructing a metal/high-dielectric-constant material/metal capacitor on a semiconductor substrate.
Figure 2:
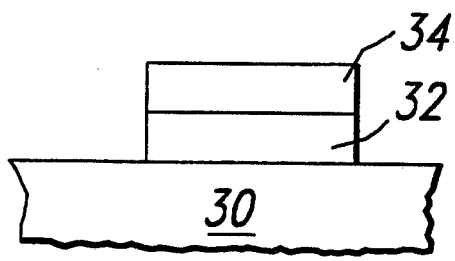
Figure 3:
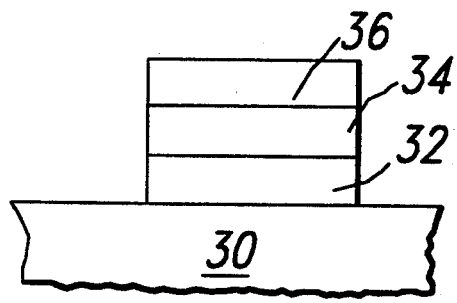
Figure 4:
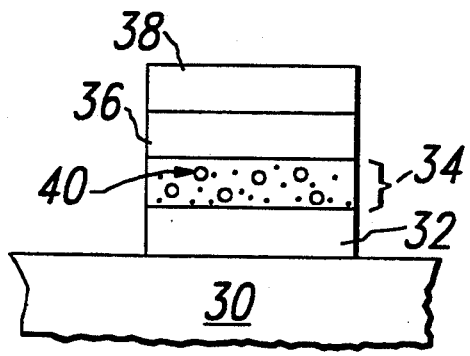
Figure 5:
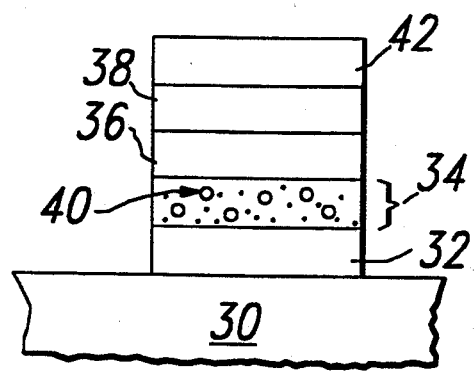

With reference to FIGS. 1-5, there is shown a method of forming a preferred embodiment of this invention, a capacitor comprising a high-dielectric-constant material and an oxygen gettering layer. FIG. 1 illustrates a tantalum sticking layer 32 deposited on the surface of a semiconductor body 30. FIG. 2 illustrates a platinum/tantalum mixture layer 34 deposited on the tantalum sticking layer 32. The ratio of platinum to tantalum in the platinum/tantalum mixture layer 34 is, in this example, between 3:1 and 1:1.5. A method of forming this oxygen gettering layer 34 involves depositing the platinum and tantalum in the same process chamber using two sputter guns, so that the desired percentages of each metal are deposited, forming a mixture of the two metals. Other processes such as evaporation or chemical vapor deposition could also be used to deposit the two metals. FIG. 3 illustrates a platinum noble layer 36 deposited on the oxygen gettering layer 34. The three layers 32, 34, and 36 constitute the lower electrode of the capacitor. FIG. 4 illustrates a barium strontium titanate layer 38 deposited on the platinum layer 36, and also the tantalum oxide particles 40 that are formed in the oxygen gettering layer 34 as a consequence of the barium strontium titanate layer 38 being deposited in a high temperature oxygen atmosphere. The lower electrode, comprising layers 32, 34, and 36, remains electrically conductive after the barium strontium titanate deposition since the oxide particles 40 are spread throughout the oxygen gettering layer 34. The barium strontium titanate layer 38 constitutes the dielectric of the capacitor. FIG. 5 illustrates a titanium nitride layer 42 deposited on the barium strontium titanate layer 38, forming the upper electrode of the capacitor. Although FIG. 5 illustrates a planar geometry for all of the elements of the capacitor, this invention applies equally well to the construction of capacitor structures of more complicated geometries, including capacitors built into depressions in the semiconductor surface.

Figure 6:
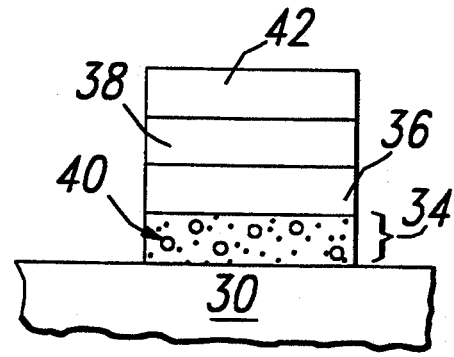
FIGS. 6–9 are cross-sectional views of metal/high-dielectric-constant material/metal capacitors formed on the surface of a semiconductor substrate.
Figure 7:
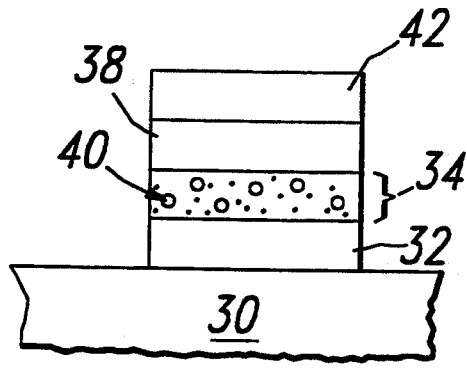
Figure 8:
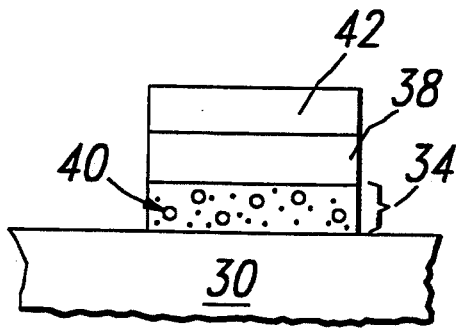

In an alternate embodiment, with reference to FIG. 6, such a capacitor structure may be formed without the tantalum layer 32 of FIG. 5, and thus the oxygen gettering layer is preventing the oxidation of the top of the substrate. In another alternate embodiment, with reference to FIG. 7, such a capacitor structure may be formed without the platinum layer 36 of FIG. 5. In another alternate embodiment, with reference to FIG. 8, such a capacitor structure may be formed without either the tantalum layer 32 or the platinum layer 36 of FIG. 5.

Figure 9:
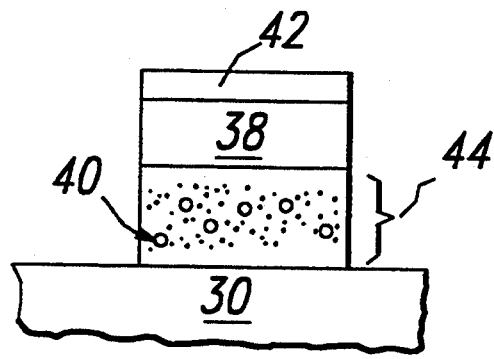

In another alternate embodiment, with reference to FIG. 9, such a capacitor structure may be formed with a lower electrode comprising a graded layer 44 in which the amounts of each metal vary with respect to depth in the layer. The graded layer 44 is formed such that primarily tantalum is deposited near the semiconductor substrate, and then as the layer continues to be formed, the amount of platinum deposited is increased while the amount of tantalum deposited is decreased. Near the top of the layer, primarily platinum is deposited.

Figure 10:
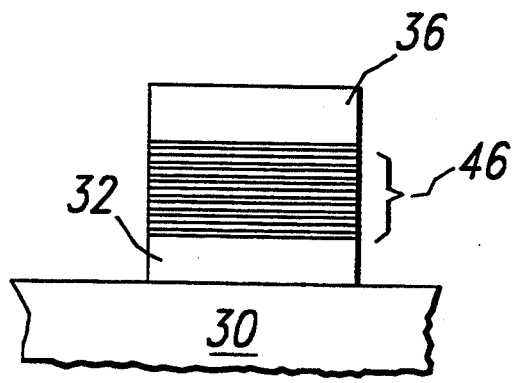
FIG. 10 is a cross-sectional view of an intermediate structure, a lower electrode formed on the surface of a semiconductor substrate, before the deposition of a high-dielectric-constant material layer.

In another alternate embodiment, with reference to FIG. 10, such a capacitor may be formed with a lower electrode comprising a stratified region 46 between the tantalum layer 32 and the platinum layer 36. This stratified region 46 comprises relatively thin alternating layers of platinum and tantalum, which will intermix when heated, dispersing the tantalum into the platinum. The number and thickness of the layers in the stratified region 46 can be varied, depending on the amounts of tantalum and platinum required. FIG. 10 depicts the lower electrode before application of the HDC material.

Figure 11:
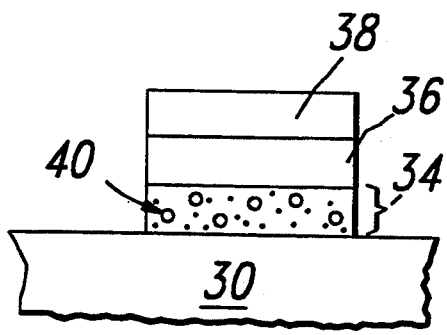
FIG. 11 is a cross-sectional view of an oxygen gettering layer providing electrical connection between a high-dielectric-constant material layer and an oxidizable layer.

In another alternate embodiment, with reference to FIG. 11, the oxygen gettering layer 34 may be formed on an oxidizable layer 48. A platinum noble layer 36 is formed on the oxygen gettering layer 34, and a barium strontium titanate layer 38 is formed on the platinum layer 36, which causes the oxide particles 40 to form.

Figure 12:
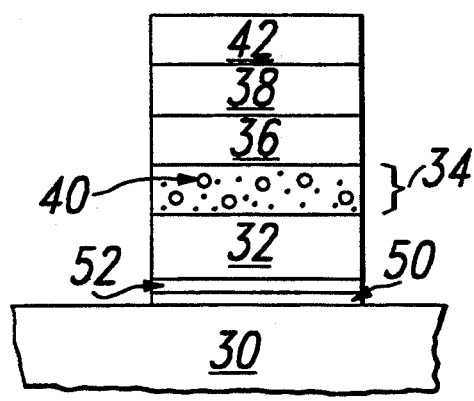
FIG. 12 is a cross-sectional view of a metal/high-dielectric-constant material/metal capacitor formed on the surface of a semiconductor substrate.

In another alternate embodiment, with reference to FIG. 12, the tantalum sticking layer 32 may be formed on a titanium nitride barrier layer 52, which is itself formed on a titanium silicide contact layer 50. The titanium nitride layer 52 and titanium silicide layer 50 are formed by depositing a thin layer of titanium on the silicon substrate 30, and then annealing in an $NH_3$ atmosphere. The titanium silicide layer 50 forms a low resistance contact to the underlying silicon substrate 30, while the titanium nitride layer 52 prevents the formation of insulating tantalum silicide between the silicon substrate 30 and the tantalum sticking layer 32.

Figure 13:
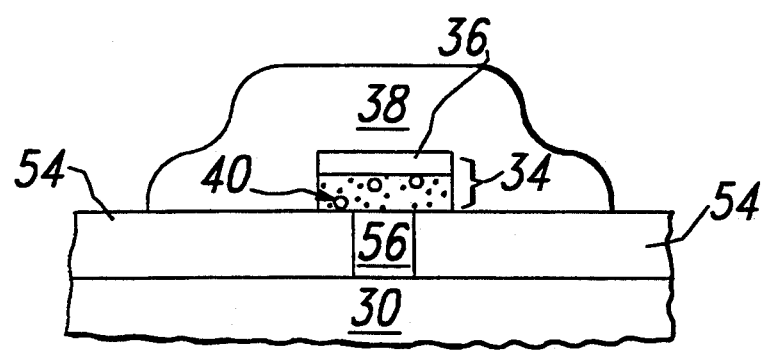
FIG. 13 is a cross-sectional view of a lower electrode providing electrical connection between a high-dielectric-constant material and a semiconductor substrate.

In yet another alternate embodiment, with reference to FIG. 13, a tantalum plug 56 is formed through a silicon dioxide insulating layer 54, connecting the platinum/tantalum mixture layer 34 to the underlying silicon substrate 30.

The sole Table, below, provides an overview of some embodiments and the drawings.

TABLE

| Drawing Element | Generic Term | Preferred or Specific Examples | Other Alternate Examples |
|---|---|---|---|
| 30 | Semiconductor Substrate | Silicon | Other single component semiconductors (e.g. germanium) Compound semiconductors (e.g. GaAs, Si/Ge, Si/C) May be the oxidizable |

TABLE-continued

| Drawing Element | Generic Term | Preferred or Specific Examples | Other Alternate Examples |
|---|---|---|---|
| | | | layer (e.g. if no sticking layer is used) |
| 32 | Sticking layer (when used, is generally the oxidizable layer) | Tantalum | Other reactive metals (e.g. tungsten, titanium, molybdenum) Reactive metal compounds (e.g. nitrides: titanium nitride, zirconium nitride; silicides: titanium silicide, tantalum silicide, tungsten silicide, molybdenum silicide; carbides: tantalum carbide; borides: titanium boride) Conductive carbides and borides (e.g. boron carbide) |
| 34 | Oxygen gettering layer | Platinum/tantalum mixture wherein the ratio of platinum to tantalum is between 3:1 and 1:1.5 | Noble metal/reactive metal mixtures wherein the ratio of noble metal to reactive metal is between 99:1 and 1:3 (e.g. other platinum/tantalum mixtures, platinum/tungsten mixtures, platinum/titanium mixtures) Noble metal/reactive metal compound mixtures wherein the ratio of noble metal to reactive metal compound is between 99:1 and 1:3 (e.g. platinum/titanium nitride mixtures) Other combinations of above mentioned materials (e.g. platinum/tantalum/tungsten mixture) Other combinations of materials selected from Drawing Element 32 above and Drawing Element 36 below (e.g. palladium/molybdenum mixtures) |
| 36 | Noble layer | Platinum | Other noble metals (e.g. palladium, rhodium, gold, iridium, silver) |
| 38 | High-dielectric-constant material | Barium strontium titanate | Other transition metal titanates, tantalates, niobates, and zirconates (e.g. barium titanate, strontium titanate, lead zirconate titanate, lead zinc niobate) Other high dielectric constant oxides (e.g. tantalum pentoxide) |
| 40 | Oxide particles | Tantalum pentoxide | Other oxides/suboxides of reactive metals and reactive metal compounds (e.g. other tantalum oxides, tungsten oxides, titanium oxides) |
| 42 | Upper electrode | Titanium nitride | Other metal nitrides Ruthenium dioxide $YBa_2Cu_3O_{7-x}$ Noble metals (e.g. platinum, palladium, rhodium, gold, iridium, silver) Other common semiconductor electrodes (e.g. silicides, aluminum) |

TABLE-continued

| Drawing Element | Generic Term | Preferred or Specific Examples | Other Alternate Examples |
|---|---|---|---|
| 44 | Graded layer | Platinum/tantalum mixture wherein the mixture is 100% tantalum near the substrate and transitions to 100% platinum near the HDC material | Other noble metal/reactive metal mixtures wherein the mixture is 100% reactive metal near the substrate and transitions to 100% nobe metal near the HDC material (e.g. platinum/tungsten mixture, platinum/titanium mixture) Noble metal/reactive metal compound mixtures wherein the mixture is 100% reactive metal compound near the substrate and transitions to 100% noble metal near the HDC material (e.g. platinum/titanium nitride mixture) Other combinations of above mentioned materials (e.g. platinum/tantalum/tungsten mixture) Other combinations of materials selected from Drawing Element 32 above and Drawing Element 36 above (e.g. palladium/molybdenum mixtures) |
| 46 | Stratified region | Alternating layers of platinum and tantalum wherein the thickness ratio of the platinum layers to the tantalum layers is between 3:1 and 1:1.5 | Alternating layers of other noble and reactive metals wherein the thickness ratio of the noble metal layers to the reactive metal layers is between 99:1 and 1:3 (e.g. platinum/tantalum platinum/tungsten, platinum/titanium) Alternating layers of noble metal and reactive metal compound wherein the thickness ratio of the noble metal layers to the reactive metal compound layers is between 99:1 and 1:3 (e.g. platinum/titanium nitride) Other combinations of above mentioned materials (e.g. platinum/tantalum/tungsten Other combinations of materials selected from Drawing Element 32 above and Drawing Element 36 below (e.g. palladium/molybdenum) |
| 48 | Oxidizable layer | Tantalum | Other reactive metals (e.g. tungsten, titanium, molybdenum) Reactive metal compounds (e.g. nitrides: titanium nitride, zirconium nitride; silicides: titanium silicide, tantalum silicide, tungsten silicide, molybdenum silicide; carbides: tantalum carbide; borides: titanium boride) |

TABLE-continued

| Drawing Element | Generic Term | Preferred or Specific Examples | Other Alternate Examples |
|---|---|---|---|
| | | | Conductive carbides and borides (e.g. boron carbide) Single component semiconductors (e.g. single crystalline and polycrystalline silcon, germanium) Compound semiconductors (e.g. GaAs, Si/Ge, Si/C) |
| 50 | Contact layer | Titanium silicide | Other conductive silicides |
| 52 | Barrier layer | Titanium nitride | Other conductive nitrides Other high-temperature conductive dffusion barriers |
| 54 | Insulator | Silicon dioxide | Other insulators (e.g. silicon nitride) |
| 56 | Conductive Plug | Tantalum | Other reactive metals (e.g. tungsten, titanium, molybdenum) Reactive metal compounds (e.g. nitrides: titanium nitride, zirconium nitride; silicides: titanium silicide, tantalum silicide, tungsten silicide, molybdenum silicide; carbides: tantalum carbide; borides: titanium boride) Conductive carbides and borides (e.g. boron carbide) Single component semiconductors (e.g. single crystalline and polycrystalline silcon, germanium) Compound semiconductors (e.g. GaAs, Si/Ge, Si/C) |

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families. In general the preferred or specific examples are preferred over the other alternate examples. Unless otherwise stated, all composition ratios or percentages are in relation to composition by weight. In some intermediate structures, and in the final product, the oxygen gettering layer will generally be at least partially oxidized.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic structure, said method comprising:
   (a) forming an oxidizable layer;
   (b) forming an oxygen gettering layer on said oxidizable layer, said oxygen gettering layer comprising a mixture of at least one noble metal and at least one reactive component;
   (c) forming a noble metal layer on said oxygen gettering layer; and
   (d) forming a layer of a high-dielectric-constant material on said noble metal layer, whereby said oxygen gettering layer getters diffusing oxygen, thus minimizing the formation of a oxidized resistive layer either in or on said oxidizable layer.

2. The method according to claim 1, wherein said oxygen gettering layer is part of a final structure and said reactive component is at least partially oxidized.

3. The method according to claim 1, wherein said oxygen gettering layer is part of an intermediate structure and said reactive component is not substantially oxidized.

4. The method according to claim 1, said method further comprising forming a electrically conductive layer on said high-dielectric-constant material layer.

5. The method according to claim 4, wherein said electrically conductive layer is selected from the group consisting of: titanium nitride, ruthenium dioxide, $YBa_2Cu_3O_{7-x}$, platinum, palladium, rhodium, gold, iridium, silver, and combinations thereof.

6. The method according to claim 1, wherein said oxygen gettering layer comprises a ratio of said noble metal to said reactive component of between 99:1 and 1:3.

7. The method according to claim 1, wherein said noble metal is selected from the group consisting of:

platinum, palladium, rhodium, gold, iridium, silver, and combinations thereof.

8. The method according to claim 1, wherein said reactive component is selected from the group consisting of: tantalum, tungsten, titanium, molybdenum, titanium nitride, zirconium nitride, titanium silicide, tantalum silicide, tungsten silicide, molybdenum silicide, tantalum carbide, titanium boride, boron carbide, silicon, germanium, carbon, GaAs, and combinations thereof.

9. The method according to claim 1, wherein said oxygen gettering layer is graded, wherein said reactive component constitutes greater than 99% of said oxygen gettering layer near said oxidizable layer, and said reactive component transitions to constitute less than 1% of said oxygen gettering layer near said noble metal layer.

10. The method according to claim 1, wherein said oxidizable layer is selected from the group consisting of: tantalum, tungsten, titanium, molybdenum, titanium nitride, zirconium nitride, titanium silicide, tantalum silicide, tungsten silicide, molybdenum silicide, tantalum carbide, titanium boride, boron carbide, silicon, germanium, carbon, GaAs, and combinations thereof.

11. The method according to claim 1, wherein said noble metal layer is selected from the group consisting of: platinum, palladium, rhodium, gold, iridium, silver, and combinations thereof.

12. The method according to claim 1, wherein said high-dielectric-constant material is selected from the group consisting of: barium strontium titanate, barium titanate, strontium titanate, lead zirconium titanate, lead zinc niobate, tantalum pentoxide, and combinations thereof.

13. A method of forming a microelectronic capacitor comprising:
   forming a first tantalum layer;
   forming a layer of a platinum/tantalum mixture comprising a ratio of said platinum to said tantalum of between 99:1 and 1:3, overlaying said first tantalum layer;
   forming a layer of platinum overlaying said platinum/tantalum mixture layer;
   forming a layer of high-dielectric-constant material overlaying said platinum layer; and
   forming an electrically conductive layer overlaying said high-dielectric-constant material layer.

14. The method according to claim 6, wherein said ratio of said noble metal to said reactive component is between 3:1 and 1:1.5.

15. The method according to claim 13, wherein said ratio of said platinum to said tantalum is between 3:1 and 1:1.5.

16. The method according to claim 13, wherein tantalum oxide particles are formed in said layer of platinum/tantalum mixture during said forming of said layer of high-dielectric-constant material.

17. The method according to claim 13, wherein said electrically conductive layer is selected from the group consisting of: titanium nitride, ruthenium dioxide, $YBa_2Cu_3O_{7-x}$, platinum, palladium, rhodium, gold, iridium, silver, and combinations thereof.

18. The method according to claim 13, wherein said high-dielectric-constant material is selected from the group consisting of: barium strontium titanate, barium titanate, strontium titanate, lead zirconium titanate, lead zinc niobate, tantalum pentoxide, and combinations thereof.

* * * * *